(12) United States Patent
Choi

(10) Patent No.: US 8,174,003 B2
(45) Date of Patent: May 8, 2012

(54) ORGANIC LIGHT EMITTING DISPLAY APPARATUS AND METHOD OF MANUFACTURING SAME

(75) Inventor: Keon-Ha Choi, Yongin (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 172 days.

(21) Appl. No.: 12/585,152

(22) Filed: Sep. 4, 2009

(65) Prior Publication Data

US 2010/0051929 A1 Mar. 4, 2010

(30) Foreign Application Priority Data

Sep. 4, 2008 (KR) .................. 10-2008-0087442

(51) Int. Cl.
*H01L 35/24* (2006.01)
(52) U.S. Cl. .................. 257/40; 257/E51.001; 313/498; 313/503
(58) Field of Classification Search .................... 257/40, 257/E51.001; 313/498, 503
See application file for complete search history.

(56) References Cited

U.S. PATENT DOCUMENTS

| | | | |
|---|---|---|---|
| 7,274,039 B2* | 9/2007 | Park | 257/72 |
| 2005/0116619 A1* | 6/2005 | Kuma et al. | 313/503 |
| 2005/0140275 A1* | 6/2005 | Park | 313/504 |

FOREIGN PATENT DOCUMENTS

| | | |
|---|---|---|
| JP | 2003264075 A | 9/2003 |
| KR | 100611213 A | 8/2006 |
| KR | 100688970 B1 | 2/2007 |
| KR | 100770267 B1 | 10/2007 |

OTHER PUBLICATIONS

Machine Translation of KR 10-2003-0014928.*
Korean Registration Determination Certificate issued by Korean Patent Office on Apr. 30, 2010 corresponding Korean Patent Application No. 10-2008-0087442 and Request for Entry of the Accompanying Document attached herewith.
Korean Office action issued on Dec. 14, 2009, corresponding to the Korean Priority Application No. 10-2008-0087442.
Enhancement of Electron Injection in Organic Light-Emitting Devices Using an AgŌLiF Cathode, by X. J. Wang, et al., Journal of Applied Physics, vol. 95, No. 7 pp. 3828-3830, published Apr. 1, 2004.

* cited by examiner

*Primary Examiner* — Anthony Ho
(74) *Attorney, Agent, or Firm* — Robert E. Bushnell, Esq.

(57) ABSTRACT

An organic light emitting display apparatus having a substrate, a plurality of first electrodes of black color formed on the substrate, separators disposed on spaces between the first electrodes, a black matrix layer that is conductive and formed on the separators, an organic light emitting layer formed on the first electrodes so as to be electrically connected to the first electrodes, and a second electrode formed on the organic light emitting layer so as to be electrically connected to the organic light emitting layer. Thus, the first electrodes can be easily formed and the image contrast can be improved.

18 Claims, 5 Drawing Sheets

ORGANIC LIGHT EMITTING DISPLAY APPARATUS AND METHOD OF MANUFACTURING SAME

CROSS REFERENCE TO RELATED APPLICATIONS

This application makes reference to, incorporates the same herein, and claims all benefits accruing under 35 U.S.C §119 from an application entitled ORGANIC LIGHT EMITTING DISPLAY APPARATUS AND METHOD OF MANUFACTURING SAME earlier filed in the Korean Industrial Property Office on 4 Sep. 2008, which was duly assigned Serial No. 10-2008-0087442 by that Office.

BACKGROUND OF THE INVENTION

1. Field of the Invention

The present invention relates to an organic light emitting display apparatus and a method of manufacturing the organic light emitting display apparatus, and more particularly, to an organic light emitting display (OLED) apparatus and a method of manufacturing the organic light emitting display apparatus whereby a first electrode can be easily formed and image contrast of the organic light emitting display apparatus can be improved.

2. Description of the Related Art

Recently, conventional display apparatuses have been replaced with flat panel display apparatuses. Among flat panel display apparatuses, field emission display apparatuses are considered as being the next generation display apparatus because they are self-emissive display apparatuses having a wide viewing angle, high contrast, and fast response speed. In addition, organic light emitting display apparatus, in which a light emission layer is formed of an organic material, have advantages such as brightness, driving voltage, and response speed that are superior to those of inorganic light emitting display apparatuses, and can also display multi-colors.

Additionally, the flat panel display apparatuses are thin and lightweight, and thus can be used as portable devices. In this case, however, when a user watches images displayed on a flat panel display apparatus in an outdoor environment, the flat panel display apparatus reflects sunlight, and thus, image contrast and visibility may be degraded.

Further, the organic light emitting display apparatus includes a first electrode and a second electrode, and an organic light emitting layer between the first and second light emitting layers. However, when the first electrode is patterned using a photolithography process, a surface characteristic of the first electrode is degraded and processing time increases.

SUMMARY OF THE INVENTION

The present invention provides an organic light emitting display apparatus including a first electrode that can be formed in a simple process, the organic light emitting display apparatus having improved image visibility and contrast, and a method of manufacturing the organic light emitting display apparatus.

According to an aspect of the present invention, there is provided an organic light emitting display apparatus including: a substrate; a plurality of first electrodes of black color formed on the substrate; separators disposed on spaces between the first electrodes; a black matrix layer that is conductive and formed on the separators; an organic light emitting layer formed on the first electrodes so as to be electrically connected to the first electrodes; and a second electrode formed on the organic light emitting layer so as to be electrically connected to the organic light emitting layer.

The first electrode may include one selected from the group consisting of Ag/Alq3, Al/LiF, Ag/LiF/Alq3, and CrOx.

The first electrodes and the black matrix layer may be formed of the same material.

The organic light emitting display apparatus may further include: an organic layer formed of the same material as that of the organic light emitting layer on an opposite side of the surface of black matrix, which faces the separator.

According to another aspect of the present invention, there is provided an organic light emitting display apparatus including: a substrate; a plurality of first electrodes formed on the substrate; a black conductive layer formed on surfaces of the first electrodes that are opposite to the substrate; separators disposed on spaces between the first electrodes; a black matrix layer that is conductive and formed on the separators; an organic light emitting layer formed on the black conductive layer to be electrically connected to the first electrodes; and a second electrode formed on the organic light emitting layer to be electrically connected to the organic light emitting layer.

The black conductive layer may include one selected from the group consisting of Ag/Alq3, Al/LiF, Ag/LiF/Alq3, and CrOx.

The black conductive layer and the black matrix layer may be formed of the same material.

The organic light emitting display apparatus may further include: an intermediate layer disposed between the separator and the black matrix layer; and an organic layer formed of the same material as that of the organic light emitting layer on a surface of the black matrix that is opposite to the separator.

The intermediate layer and the first electrodes may be formed of the same material.

According to another aspect of the present invention, there is provided a method of manufacturing an organic light emitting display apparatus, the method including: forming separators on a substrate; forming a plurality of first electrodes on spaces of the substrate masked by the separators; forming a black matrix on each of the separators; forming an organic light emitting layer on each of the first electrodes, the organic light emitting layer being electrically connected to the first electrodes; and forming a second electrode on the organic light emitting layer, the second electrode being electrically connected to the organic light emitting layer.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Embodiments of the present invention will be described in detail with reference to accompanying drawings.

Figure 1:
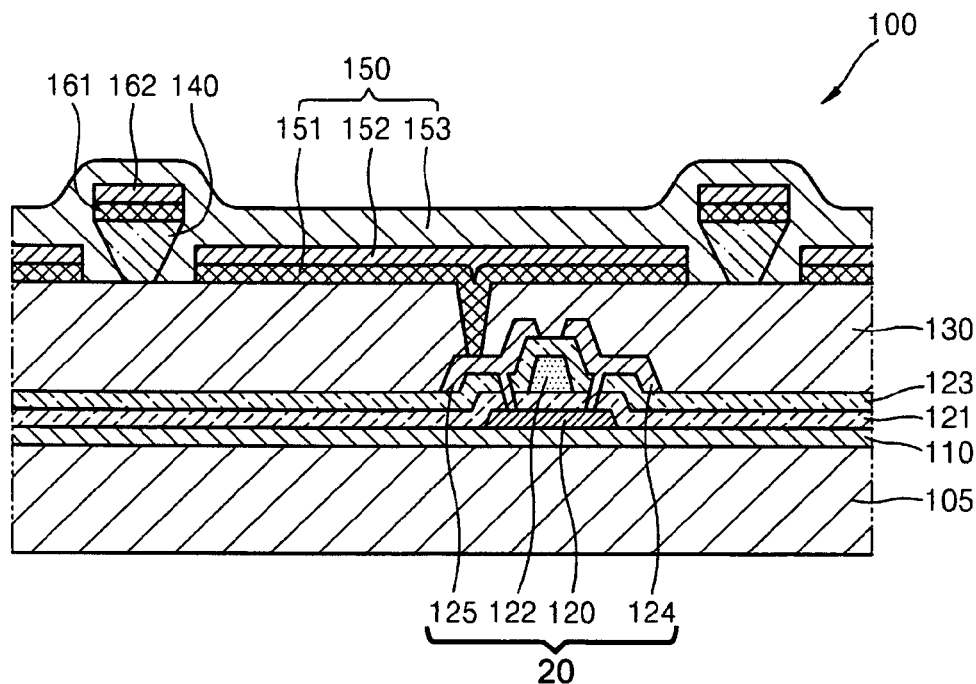
FIG. 1 is a schematic cross-sectional view of an organic light emitting display apparatus according to an embodiment of the present invention.

FIG. 1 is a schematic cross-sectional view of an organic light emitting display apparatus according to an embodiment of the present invention.

Referring to FIG. 1, the organic light emitting display apparatus 100 includes a substrate 105, a plurality of first electrodes 151 respectively corresponding to a plurality of pixels a separator 140, a black matrix layer 161, an organic light emitting layer 152, and a second electrode 153.

The first electrodes 151 are formed to be black. The black matrix layer 161 formed on the separator 140 is conductive and formed of the same material as that of the first electrode 151.

The organic light emitting display apparatus 100 also includes a plurality of organic light emitting devices 150. Each of the organic light emitting devices 150 includes the first electrode 151, the second electrode 153, and the organic light emitting layer 152. The organic light emitting layer 152 is disposed between the first electrode 151 and the second electrode 153.

Detailed descriptions of each of these members will be described with regard to the method of manufacturing the organic light emitting display apparatus.

FIGS. 2 through 5 are cross-sectional view illustrating the method of manufacturing the organic light emitting display apparatus of FIG. 1.

Figure 2:
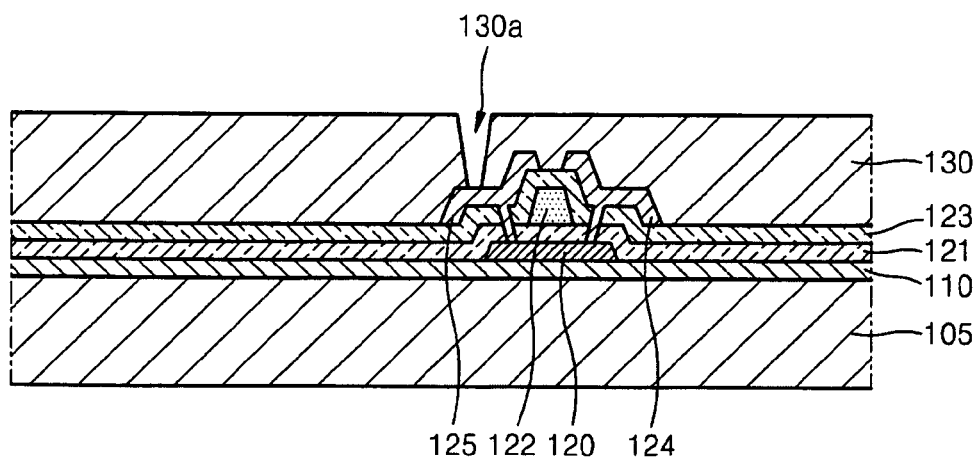
FIGS. 2 through 5 are cross-sectional views illustrating processes of manufacturing the organic light emitting display apparatus of FIG. 1.

FIG. 2 is a cross-sectional view illustrating processes before forming the organic light emitting device 150 in the organic light emitting display apparatus 100. Referring to FIG. 2, the organic light emitting display apparatus 100 includes the substrate 105.

The substrate 105 can be formed of a transparent glass material mainly including SiO2. However, the substrate 105 is not limited to the above example, and can be formed of a transparent plastic material.

When the substrate 105 is formed of the plastic material, the plastic material can be an insulating organic material selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, poly carbonate (PC), cellulose tri-acetate (TAC), and cellulose acetate propinonate (CAP).

In a bottom emission type display apparatus, in which images are formed on the substrate 105, the substrate 105 should be formed of the transparent material. However, in a top emission type display apparatus, in which the images are formed on opposite side of the substrate 105, there is no need to form the substrate 105 of a transparent material. In this case, the substrate 105 can be formed of metal.

When the substrate 105 is formed of metal, the substrate 105 may include one or more materials selected from the group consisting of carbon, iron, chrome, manganese, nickel, titanium, molybdenum, stainless steel, Invar alloy, Inconel alloy, and Kovar alloy, however, it is not limited thereto. For example, the substrate 105 can be formed of a metal foil.

A buffer layer 110 can be formed on an upper surface of the substrate 105 in order to level the substrate 105 and block infiltration of impurities. The buffer layer 110 can be formed of SiO2 and/or SiNx.

A thin film transistor (TFT) 20 is formed on the upper surface of the substrate 105. At least one TFT 20 is formed on each of the pixels. The TFT 20 is electrically connected to the organic light emitting device 150. The TFT 20 includes an active layer 120, a gate electrode 122, a source electrode 124, and a drain electrode 125.

In more detail, the active layer 120 having a predetermined pattern is formed on the buffer layer 110. The active layer 120 can be formed of an inorganic semiconductor such as amorphous silicon or poly silicon, or organic semiconductor, and the active layer 120 includes a source region, a drain region, and a channel region.

The source and drain regions can be formed by doping the active layer 120, which is formed of amorphous silicon or poly silicon, with impurities. When the active layer is doped with III-group element, for example, boron (B), p-type semiconductor can be formed, and when the active layer is doped with V-group element, for example, nitrogen (N), n-type semiconductor can be formed.

A gate insulating layer 121 formed of SiO2 or SiNx is formed on the active layer 120. The gate insulating layer 121 can be formed of an inorganic material such as a metal oxide or a metal nitride, or an organic material such as insulating polymer.

The gate electrode 122 is formed on a part on the gate insulating layer 121. The gate electrode 122 is connected to a gate line (not shown) that applies on/off signals to TFT 20. The gate electrode 122 can be formed of metal or metal alloy such as Au, Ag, Cu, Ni, Pt, Pd, Al, Mo, Al/Nd alloy, or Mo/W alloy, however, it is not limited thereto.

An interlayer dielectric 123 is formed on the gate electrode 122, and the source electrode 124 and the drain electrode 125 respectively contact the source and drain regions of the active layer 120 through contact holes in the gate insulating layer 121 and interlayer dielectric 123. The source electrode 124 and the drain electrode 125 may be formed of Au, Pd, Pt, Ni, Rh, Ru, Ir, or Os, or an alloy of two or more metals such as Al, Mo, Al/Nd alloy, or MoW alloy, however, it is not limited thereto.

The TFT 20 is covered by a passivation layer 130. The passivation layer 130 may be an inorganic insulating layer and/or an organic insulating layer, and the inorganic insulating layer may include SiO2, SiNx, SiON, Al2O3, TiO2, Ta2O5, HfO2, ZrO2, BST, or PZT.

The organic insulating layer may include common polymer (PMMA and PS), polymer derivatives including phenol group, acrylic-based polymer, imide-based polymer, arylether based polymer, amide-based polymer, fluoride-based polymer, p-xylene based polymer, vinyl alcohol based polymer, and blend thereof. The passivation layer 130 may be a combined deposition layer of the inorganic and organic insulating layers.

The passivation layer 130 includes a via hole 130a, which exposes the drain electrode 125.

Figure 3:
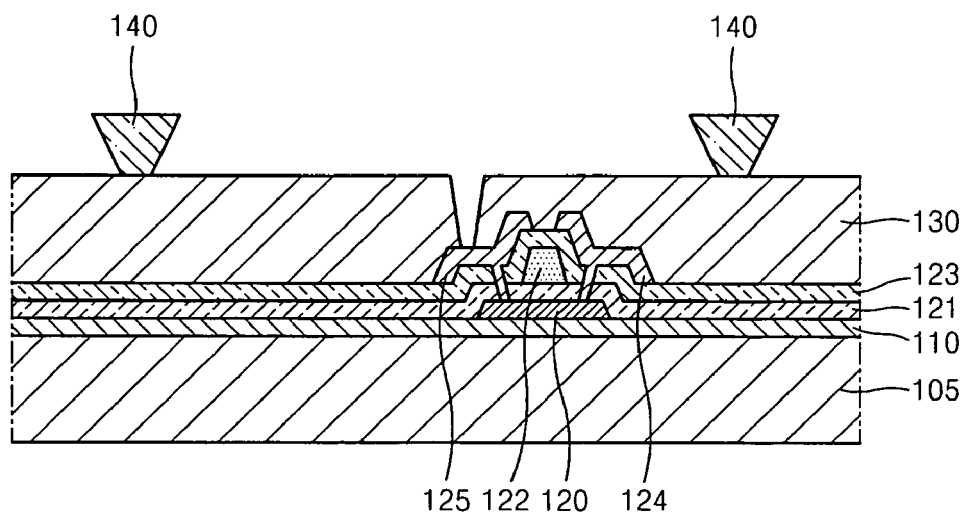

Referring to FIG. 3, the separator 140 is formed on the passivation layer 130. The separator 140 may be patterned to separate the pixels from each other. The separator 140 may include polyimide, novlac resin, polyacryl, SiO2, SiN, or polyolefin. However, the present invention is not limited to the above example, and the separator 140 can be formed of various insulating materials.

When the separator 140 is patterned, the separator 140 can be formed in an overhang structure, wedge shape or trapezoid shape, having greater width on its upper portion by adjusting etching conditions in the patterning operation.

Figure 4:
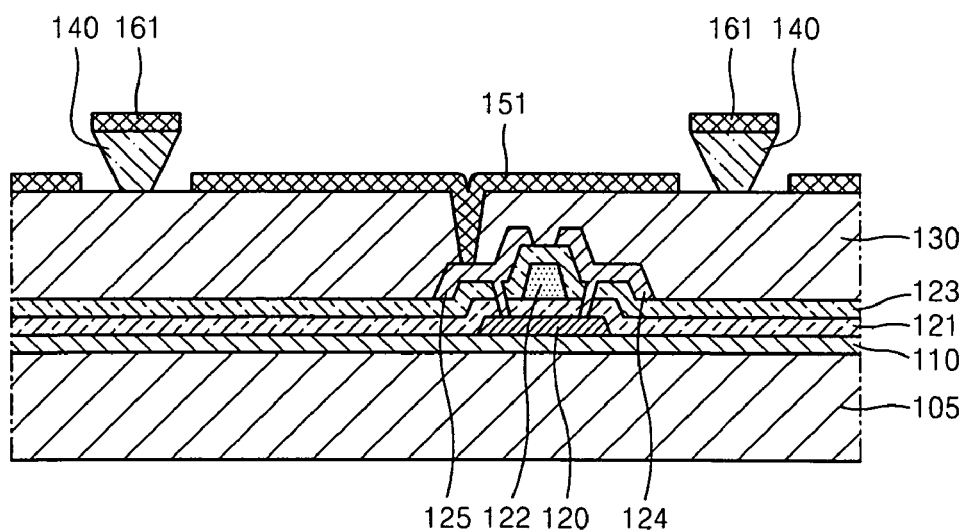

Referring to FIG. 4, the first electrodes 151 are formed. The first electrodes 151 are formed of a black material, for example, one selected from the group consisting of Ag/Alq3, Al/LiF, Ag/LiF/Alq3, and CrOx.

Since the first electrodes 151 are formed after forming the separator 140, the first electrodes 151 are patterned on the passivation layer 130 where the separator 140 is not formed. Since the first electrodes 151 can be patterned without performing an additional process such as a photolithography, fabrication processes can be reduced. In addition, since there is no need to perform the etching process, the surface of the first electrode 151 is not damaged by etchant.

The first electrodes 151 are electrically connected to the organic light emitting layer 152, and at this time, the electrical property depends on a property of an interface, where the first electrode 151 and the organic light emitting layer 152 contact each other. Since the surface of the first electrode 151, which contacts the organic light emitting layer 152, is not damaged by the etchant according to the present embodiment, the surface is not rough.

Accordingly, interfacial properties of the surface contacting the organic light emitting layer 152 are improved, and thus, reduction of electric properties of the organic light emitting device 150 can be prevented.

The black matrix layer 161 is formed on the separator 140. The black matrix layer 161 is formed of the same material as that of the first electrode 151. The black matrix layer 161 may include one selected from the group consisting of Ag/Alq3, Al/LiF, Ag/LiF/Alq3 and CrOx.

Since the first electrodes 151 are formed without using an additional mask, the black matrix layer 161, formed of the same material as that of the first electrodes 151, can be formed on the separator 140. Therefore, the first electrodes 151 and the black matrix layer 161 can be formed simultaneously.

When the black matrix layer 161 is formed on the separator 140 that corresponds to a non-emissive region of the organic light emitting display apparatus 100, the contrast of the organic light emitting display apparatus 100 can be improved.

Figure 5:
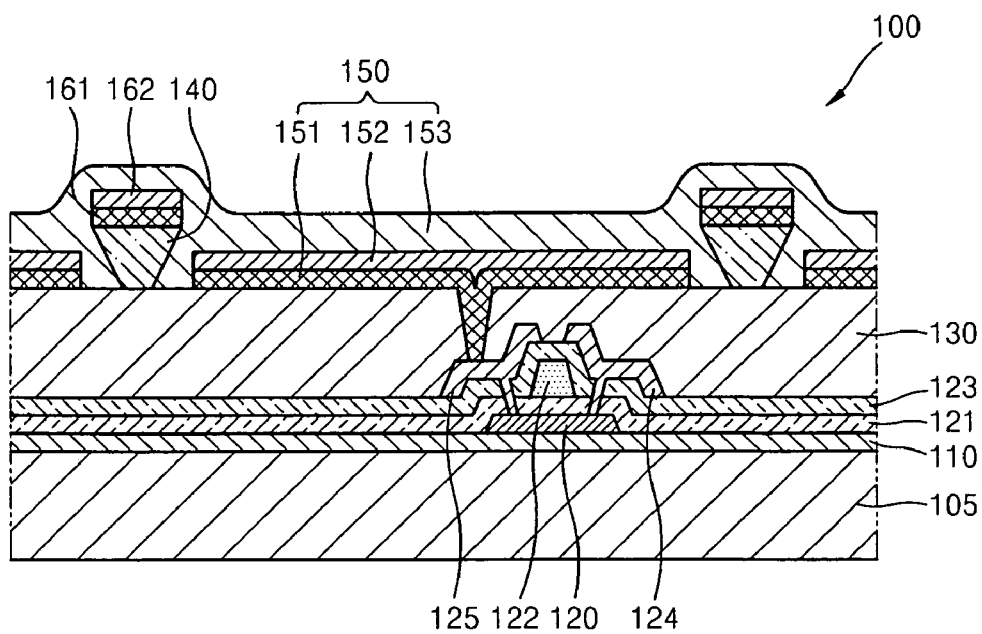

Referring to FIG. 5, the organic light emitting layer 152 and the second electrode 153 are sequentially formed. The organic light emitting device 150 includes the first electrodes 151, the second electrode 153, and the organic light emitting layer 152. The organic light emitting layer 152 disposed between the first electrodes 151 and the second electrode 153 emits the light due the electrical driving of the first electrodes 151 and the second electrode 153.

When the organic light emitting layer 152 is formed on the first electrodes 151, the organic light emitting layer 152 is naturally patterned due to the separator 140. In addition, an organic layer 162, formed of the same material as that of the organic light emitting layer 152, is formed on the black matrix layer 161 on the separator 140.

The organic light emitting layer 152 can be formed of a low-molecular organic material or a polymer organic material. When the organic light emitting layer 152 is formed of the low-molecular organic material, a hole transport layer and a hole injection layer are deposited on a side of the first electrode 151, and an electron transport layer and an electron injection layer are deposited on a side of the second electrode 153 based on the organic light emitting layer 152.

Moreover, various layers can be deposited if necessary.

The organic material may be copper phthalocyanine (CuPc), N,N'-Di(naphthalene-1-yl)-N,N'-diphenyl-benzidine (NPB), or tris-(8-hydroxyquinoline) aluminum $Al(C_9H_6NO)_3$ widely abbreviated as Alq3.

On the other hand, when the organic light emitting layer 152 is formed of the polymer organic material, the hole transport layer (HTL) only can be formed on the side of the first electrode 151 based on the organic light emitting layer 152. The hole transport layer may be formed of poly-(2,4)-ethylene-dihydroxy thiophene (PEDOT) or polyaniline (PANI) on the upper portion of the first electrode 151 using an inkjet printing process or a spin coating process. The polymer organic light emitting layer 152 can be formed of PPV, Soluble PPV's, Cyano-PPV, or polyfluorene, and the organic light emitting layer 152 can be formed using the inkjet printing process, the spin coating process, or a thermal transfer method using laser.

The second electrode 153 is disposed on the organic light emitting layer 152, and the second electrode 153 can perform as a cathode when it is connected to an external terminal (not shown). The second electrode 153 can be formed on and throughout the entire active region on which images are displayed.

The second electrode 153 may be a transparent electrode. The transparent electrode can be formed by depositing metal having a small work function such as Ag, Mg, Al, Pt, Pd, Au, Ni, Nd, Ir, Cr, Li, Ca, or a compound thereof, and after that, forming an auxiliary electrode layer or a bus electrode line using a transparent conductive material such as indium tin oxide (ITO), indium zinc oxide (IZO), or In2O3.

The material for forming the second electrode 153 is not limited to the above example, and the second electrode 153 may be formed of a conductive organic material or a conductive paste including conductive particles such as Ag, Mg, and Cu. When the second electrode 153 is formed of the conductive paste, the conductive paste is printed using the inkjet printing process, and then, baked to form the second electrode 153.

Although it is not shown in the drawings, a sealing member may be formed on the second electrode 153. The sealing member seals the organic light emitting device 150 to protect the organic light emitting device 150 from external moisture or oxygen. The sealing member (not shown) is formed of a transparent material.

Figure 6:
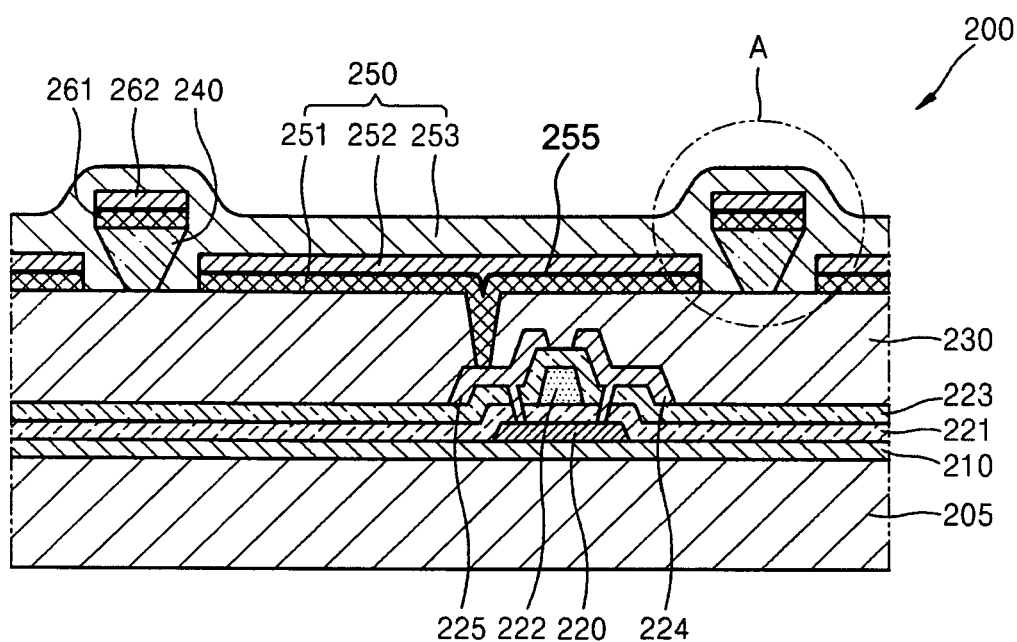
FIG. 6 is a schematic cross-sectional view of an organic light emitting display apparatus according to another embodiment of the present invention.
Figure 7:
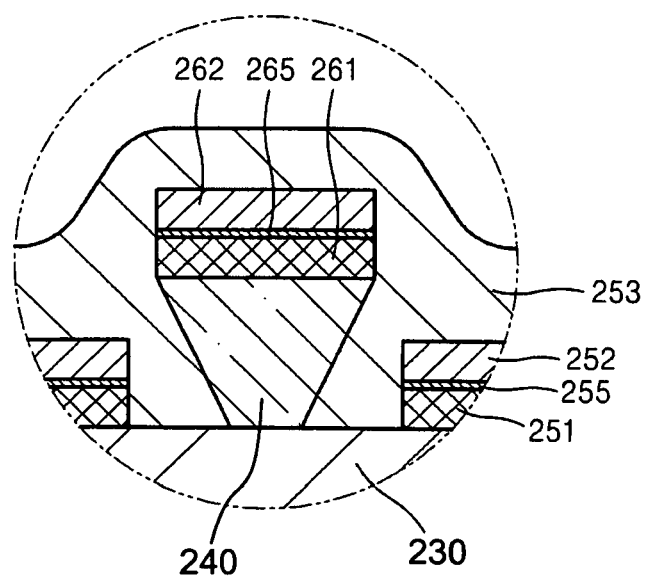
FIG. 7 is an expanded view of portion A of FIG. 6.

FIG. 6 is a schematic cross-sectional view of an organic light emitting display apparatus according to another embodiment of the present invention, and FIG. 7 is a diagram expanding portion A of FIG. 6. Differences from the previous embodiment will be described for convenience sake.

The organic light emitting display apparatus 200, according to the present embodiment, includes a substrate 205, an organic light emitting device 250, a separator 240, a black conductive layer 255, and a black matrix layer 265.

The substrate 205 can be formed of a transparent glass material including SiO2 as main ingredient. However, the present invention is not limited thereto, and the substrate 205 may be formed of a transparent plastic material.

In the top emission type display apparatus, in which images are displayed on opposite side of the substrate 205, there is no need to form the substrate 205 using the transparent material. In this case, the substrate 205 can be formed of metal.

A buffer layer 210 is formed of SiO2 and/or SiNx on the substrate 205. An active layer 220 having a predetermined pattern is formed on the buffer layer 210. The active layer 220 includes a source region, a drain region, and a channel region.

A gate insulating layer 221 is formed of SiO2 or SiNx on the active layer 220. The gate insulating layer 221 can be formed of an inorganic material such as a metal oxide or a metal nitride, or an organic material such as insulating polymer.

A gate electrode 222 is formed on a predetermined portion on the gate insulating layer 221. An interlayer dielectric 223 is formed on the gate electrode 222, and a source electrode 224 and a drain electrode 225 respectively contact the source and drain regions of the active layer 220 through contact holes in the gate insulating layer 221 and interlayer dielectric 223.

A passivation layer 230 is formed to cover the source electrode 224, the drain electrode 225 and interlayer dielectric 223. The passivation layer 230 may be an inorganic insulating layer and/or organic insulating layer.

The separator 240 is formed on the passivation layer 230. The separator 240 can separate the pixels from each other. The separator 240 may include polyimide, novlac resin, polyacryl, $SiO_2$, SiN, or polyolefin. However, the present invention is not limited to the above example, and the separator 240 can be formed of various insulating materials.

The separator 240 may be formed in an overhang structure, wedge shape or trapezoid shape, which has greater width at an upper portion thereof, by adjusting the etching conditions in the patterning process of the separator 240.

The first electrodes 251 are formed on the passivation layer 230. The first electrodes 251 are electrically connected to the drain electrode 225 through a via hole formed in the passivation layer 230. In the case of the top emission type display apparatus, in which the images are displayed on an opposite side of the substrate 205, that is, on upper portion of FIG. 6, the first electrode 251 can be formed of a reflective material. The first electrode 251 can be fabricated by forming a reflective layer using Ag, Mg, Al, Pt, Pd, Au, Ni, Nd, Ir, Cr, Li, Ca, or a compound thereof, and then, depositing a material having a high work function such as ITO, IZO, ZnO, or $In_2O_3$ on the reflective layer.

The black conductive layer 255 is formed on the first electrode 251. The black conductive layer 255 may include one selected from the group consisting of $Ag/Alq_3$, Al/LiF, $Ag/LiF/Alq_3$, and CrOx.

Since the first electrodes 251 are formed after forming the separator 240, the first electrodes 251 are naturally patterned on a portion of the passivation layer 230, where the separator 240 is not formed. Therefore, the first electrodes 251 can be patterned without performing an additional process such as a photolithography process, and thus, the number of fabrication processes can be reduced. In addition, the etching process is not necessary, and thus, the surfaces of the first electrodes 251 are not damaged by the etchant.

An intermediate layer 261 is formed on the separator 240 of the same material as that of the first electrode 251. The black matrix layer 265 is formed on the intermediate layer 261 using the same material as that of the black conductive layer 255. The black matrix layer 265 may include one selected from the group consisting of $Ag/Alq_3$, Al/LiF, $Ag/LiF/Alq_3$, and CrOx.

Since the first electrodes 251 are formed without using an additional mask, the intermediate layer 261 is formed on the separator 240 of the same material as that of the first electrodes 251. Likewise, the black matrix layer 265 can be formed on the intermediate layer 261 of the same material as that of the black conductive layer 255.

The black matrix layer 265 is formed on the separator 240, which corresponds to a non-emissive region of the organic light emitting display apparatus 200, and thus, the contrast of the organic light emitting display apparatus 200 can be improved.

An organic light emitting layer 252 and the second electrode 253 are sequentially formed on the first electrodes 251. When the organic light emitting layer 252 is formed on the first electrodes 251, the organic light emitting layer 252 is patterned due to the separator 240. In more detail, the organic light emitting layer 252 is formed on the black conductive layer 255. Also, an organic layer 262 including the same material as that of the organic light emitting layer 252 is formed on the black matrix layer 265 on the separator 240.

The organic light emitting layer 252 may be formed of a low molecular organic material or a polymer organic material. When the organic light emitting layer 252 is formed of the low-molecular organic material, a hole transport layer and a hole injection layer are deposited on a side of the first electrode 251, and an electron transport layer and an electron injection layer are deposited on a side of the second electrode 253 based on the organic light emitting layer 252.

Besides, various layers may be deposited if necessary. The organic material may be copper phthalocyanine (CuPc), N,N'-Di(naphthalene-1-yl)-N,N'-diphenyl-benzidine (NPB), and tris-8-hydroxyquinoline aluminum ($Alq_3$).

On the other hand, when the organic light emitting layer 252 is formed of the polymer organic material, the hole transport layer is only formed on the side of the first electrode 251. The hole transport layer is formed on the first electrode 251 using poly-(2,4)-ethylene-dihydroxy thiophene (PEDOT) or polyaniline (PANI) in the inkjet printing process or the spin coating process. In addition, the polymer organic light emitting layer 252 can be formed of PPV, Soluble PPV, Cyano-PPV, polyfluorene using the inkjet printing process, the spin coating process, or the thermal transfer process using laser.

The second electrode 253 is disposed on the organic light emitting layer 252, and the second electrode 253 may perform as a cathode by being connected to an external terminal (not shown). The second electrode 253 may be formed on and throughout the entire active region on which the images are displayed.

The second electrode 253 may be the transparent electrode. The transparent electrode can be formed by depositing metal having small work function such as Ag, Mg, Al, Pt, Pd, Au, Ni, Nd, Ir, Cr, Li, Ca, and an alloy thereof, and then, forming an auxiliary electrode layer or a but electrode line using a transparent conductive material such as ITO, IZO, ZnO, or $In_2O_3$.

The material forming the second electrode 253 is not limited to the above examples, and the second electrode 253 can be formed of a conductive paste including a conductive organic material or conductive particles such as Ag, Mg, or Cu. When the second electrode 253 is formed of the conductive paste, the conductive paste is printed using the inkjet printing process and then baked to be used as the electrode.

Although it is not shown in the drawings, a sealing member can be formed on the second electrode 253. The sealing member seals the organic light emitting device 250 to protect the organic light emitting device 250 from the external moisture or oxygen. The sealing member (not shown) is formed of a transparent material.

The above description is for the active matrix (AM) type display apparatus, however, the present invention can be also applied to a passive matrix (PM) type display apparatus.

Figure 8:
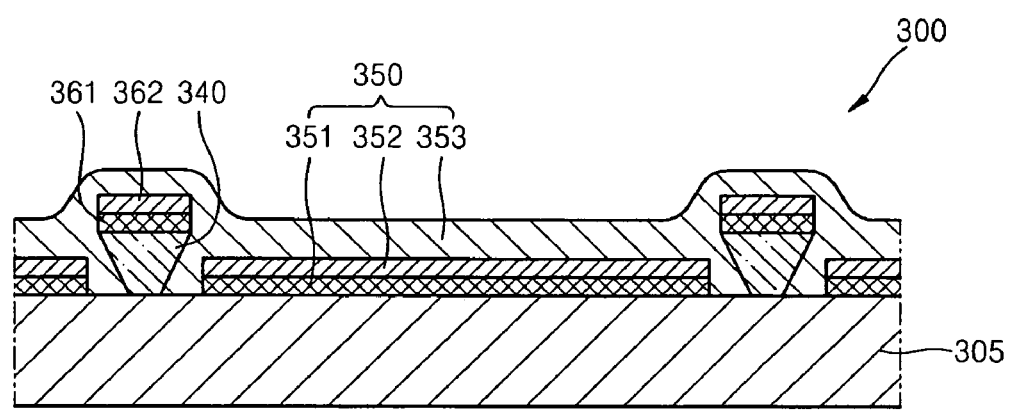
FIG. 8 is a schematic cross-sectional view of an organic light emitting display apparatus according to another embodiment of the present invention.

FIG. 8 is a schematic cross-sectional view of an organic light emitting display apparatus according to another embodiment of the present invention.

The organic light emitting display apparatus 300 of the present embodiment is a PM type display apparatus. The organic light emitting display apparatus 300 includes a substrate 305, a separator 340, a plurality of first electrodes 351 respectively corresponding to a plurality of pixels, an organic light emitting layer 352, a second electrode 353, and a black matrix layer 361.

The first electrodes 351 are formed to be black. The black matrix layer 361 formed on the separator 340 is formed of the same material as that of the first electrode 351 and is conductive.

Referring to FIG. 8, the substrate 305 may be formed of a transparent glass material including $SiO_2$ as the main ingredient. However, the present invention is not limited thereto, and the substrate 305 may be formed of a transparent plastic material.

In a bottom emission type display apparatus, in which images are formed on the substrate 305, the substrate 305 should be formed of the transparent material. However, in a top emission type display apparatus, in which the images are formed on opposite side of the substrate 305, there is no need to form the substrate 305 using the transparent material. In this case, the substrate 305 can be formed of metal.

When the substrate 305 is formed of metal, the substrate 305 may include one or more materials selected from the group consisting of carbon, iron, chrome, manganese, nickel, titanium, molybdenum, stainless steel, Invar alloy, Inconel alloy, and Kovar alloy, however, it is not limited thereto. For example, the substrate 305 can be formed of a metal foil.

Although it is not shown in the drawings, a buffer layer (not shown) can be formed on an upper surface of the substrate 305 in order to level the substrate 305 and blocking infiltration of impurities. The buffer layer can be formed of SiO2 and/or SiNx.

The separator 340 is formed on the substrate 305. The separator 340 separates the pixels from each other. The separator 340 may include polyimide, novlac resin, polyacryl, SiO2, SiN, or polyolefin. However, the present invention is not limited to the above example, and the separator 340 can be formed using various insulating materials.

The separator 340 can be formed in an overhang structure, wedge shape or trapezoid shape, having greater width at an upper portion thereof by adjusting the etching conditions in the patterning process. Otherwise, the separator 340 may be formed in a stripe shape so as to perform as a mask used in patterning of the first electrodes 351.

After forming the separator 340 on the substrate 305, the first electrodes 351 are formed. Since the first electrodes 351 are formed after forming the separator 340, the first electrodes 351 are naturally patterned on the space where the separator 340 is not formed. That is, the first electrodes 351 can be formed in the form of stripes separated at predetermined distances from each other. The first electrodes 351 are formed of a conductive material of black color. The first electrode 151 may include one selected from the group consisting of Ag/Alq3, Al/LiF, Ag/LiF/Alq3, and CrOx.

Like in the above embodiments, the first electrodes 351 of the present embodiment can be patterned without performing an additional process such as a photolithography process, and thus, the number of fabrication processes can be reduced. In addition, there is no need for an etching process, and thus the surface of the first electrodes 351 is not damaged by the etchant.

The first electrodes 351 are electrically connected to the organic light emitting layer 352, and at this time, the electrical property of the connection depends on a property of an interface where the first electrodes 351 and the organic light emitting layer 352 contact each other. Since the surfaces of the first electrodes 351, which contact the organic light emitting layer 352, are not damaged by the etchant according to the present embodiment, the surfaces are not rough. Accordingly, interfacial properties of the surface contacting the organic light emitting layer 352 are improved, and thus, reduction of electric properties of the organic light emitting device 350 can be prevented.

The black matrix layer 361 is formed on the separator 340. The black matrix layer 361 is formed of the same material as that of the first electrode 351. The black matrix layer 361 may include one selected from the group consisting of Ag/Alq3, Al/LiF, Ag/LiF/Alq3 and CrOx.

Since the first electrodes 351 are formed without using an additional mask, the black matrix layer 361 formed of the same material as that of the first electrode 351 can be formed on the separator 340. Therefore, the first electrode 351 and the black matrix layer 361 can be formed simultaneously.

When the black matrix layer 361 is formed on the separator 340 that corresponds to a non-emissive region of the organic light emitting display apparatus 300, the contrast of the organic light emitting display apparatus 300 can be improved.

After forming the first electrodes 351, the organic light emitting layer 352 and the second electrode 353 are sequentially formed. The organic light emitting device 350 includes the first electrode 351, the second electrode 353, and the organic light emitting layer 352. The organic light emitting layer 352 disposed between the first electrodes 351 and the second electrode 353 emits the light due the electrical driving of the first electrodes 351 and the second electrode 353.

When the organic light emitting layer 352 is formed on the first electrode 351, the organic light emitting layer 352 is naturally patterned due to the separator 340. In addition, an organic layer 362 formed of the same material as that of the organic light emitting layer 352 is formed on the black matrix layer 361 on the separator 340.

The organic light emitting layer 352 can be formed of a low-molecular organic material or a polymer organic material. When the organic light emitting layer 352 is formed of the low-molecular organic material, a hole transport layer and a hole injection layer are deposited on a side of the first electrode 351, and an electron transport layer and an electron injection layer are deposited on a side of the second electrode 353 based on the organic light emitting layer 352.

Moreover, various layers can be deposited if necessary. The organic material may be copper phthalocyanine (CuPc), N,N'-Di(naphthalene-1-yl)-N,N'-diphenyl-benzidine (NPB), or tris-8-hydroxyquinoline aluminum (Alq3).

On the other hand, when the organic light emitting layer 352 is formed of the polymer organic material, the hole transport layer only can be formed on the side of the first electrode 351 based on the organic light emitting layer 352. The hole transport layer may be formed of PEDOT or PANI on the upper portion of the first electrode 351 using an inkjet printing process or a spin coating process. The polymer organic light emitting layer 352 can be formed of PPV, Soluble PPV's, cyano-PPV, or polyfluorene, and the organic light emitting layer 352 can be formed using the inkjet printing process, the spin coating process, or a thermal transfer method using laser.

The second electrode 353 is disposed on the organic light emitting layer 352, and the second electrode 353 may perform as a cathode by being connected to an external terminal (not shown). The second electrode 353 may be formed to cross the first electrodes 351.

The second electrode 353 may be a transparent electrode. The transparent electrode can be formed by depositing metal having small work function such as Ag, Mg, Al, Pt, Pd, Au, Ni, Nd, Ir, Cr, Li, Ca, and an alloy thereof, and then, forming an auxiliary electrode layer or a but electrode line using a transparent conductive material such as ITO, IZO, ZnO, or In2O3.

The material for forming the second electrode 353 is not limited to the above examples, and the second electrode 353 can be formed of a conductive paste including a conductive organic material or conductive particles such as Ag, Mg, or Cu. When the second electrode 353 is formed of the conductive paste, the conductive paste is printed using the inkjet printing process and then baked to be used as the electrode.

Although it is not shown in the drawings, a sealing member can be formed on the second electrode 353. The sealing member seals the organic light emitting device 350 to protect the organic light emitting device 350 from the external moisture or oxygen. The sealing member (not shown) is formed of a transparent material.

According to the organic light emitting display apparatus and the method of manufacturing the same of the present invention, the first electrodes can be easily formed using the separator, and the black matrix is formed on the separator to improve the contrast and visuality, and improve the image quality properties.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus comprising:
   a substrate;
   a plurality of first electrodes of black color formed on the substrate;
   separators disposed on spaces between the first electrodes;
   an intermediate layer on each of the separators;
   a black conductive layer on each of said first electrodes;
   a black matrix layer that is conductive and formed on the intermediate layer;
   an organic light emitting layer formed on the black conductive layer on each of the first electrodes, the organic light emitting layer being electrically connected to the first electrodes; and
   a second electrode formed on the organic light emitting layer, the second electrode being electrically connected to the organic light emitting layer.

2. The organic light emitting display apparatus of claim 1, wherein the first electrode includes one selected from a group consisting of Ag/Alq3, Al/LiF, Ag/LiF/Alq3, and CrOx.

3. The organic light emitting display apparatus of claim 1, wherein the first electrodes and the intermediate layer are formed of the same material.

4. The organic light emitting display apparatus of claim 1, further comprising:
   an organic layer formed on an upper surface of black matrix, the organic layer being formed of the same material as that of the organic light emitting layer.

5. An organic light emitting display apparatus comprising:
   a substrate;
   separators disposed a predetermined distance from each other on the substrate;
   a plurality of first electrodes formed between the separators and on the substrate;
   a black conductive layer formed on surfaces of the first electrodes that are opposite to the substrate;
   a black matrix layer that is conductive and formed on the separators;
   an organic light emitting layer formed on the black conductive layer, the organic light emitting layer being electrically connected to the first electrodes; and
   a second electrode formed on the organic light emitting layer, the second electrode being electrically connected to the organic light emitting layer.

6. The organic light emitting display apparatus of claim 5, wherein the black conductive layer includes one selected from a group consisting of Ag/Alq3, Al/LiF, Ag/LiF/Alq3, and CrOx.

7. The organic light emitting display apparatus of claim 5, wherein the black conductive layer and the black matrix layer are formed of the same material.

8. The organic light emitting display apparatus of claim 5, further comprising:
   an intermediate layer disposed between the separator and the black matrix layer; and
   an organic layer formed of the same material as that of the organic light emitting layer on a surface of the black matrix that is opposite to the separator.

9. The organic light emitting display apparatus of claim 8, wherein the intermediate layer and the first electrodes are formed of the same material.

10. A method of manufacturing an organic light emitting display apparatus, the method comprising:
    forming separators on a substrate;
    forming a plurality of first electrodes on spaces of the substrate masked by the separators;
    forming a black conductive layer on surfaces of the first electrodes that are opposite to the substrate;
    forming a black matrix on each of the separators;
    forming an organic light emitting layer on the black conductive layer on each of the first electrodes, the organic light emitting layer being electrically connected to the first electrodes; and
    forming a second electrode on the organic light emitting layer, the second electrode being electrically connected to the organic light emitting layer.

11. The method as set forth in claim 10, further comprising forming said plurality of first electrodes using a black material selected from a group consisting of Ag/Alq3, Al/LiF, Ag/LiF/Alq3, and CrOx.

12. The method as set forth in claim 10 wherein said black conductive material is selected from a group consisting of Ag/Alq3, Al/LiF, Ag/LiF/Alq3, and CrOx.

13. The method as set forth in claim 10, further comprising forming an organic layer on each said black matrix.

14. The method as set forth in claim 13, wherein said organic layer and said organic light emitting layer are formed simultaneously from a same material.

15. The method as set forth in claim 10, further comprising:
    forming an intermediate layer on each of the separators.

16. The method as set forth in claim 15, further comprising forming said black matrix on said intermediate layer and said organic light emitting layer on said black conductive layer, said black matrix and said black conductive layer being formed simultaneously from a same material.

17. The method as set forth in claim 15, further comprising forming said black matrix on said intermediate layer and said organic light emitting layer on said black conductive layer, said first electrodes and said intermediate layer being formed from a same material.

18. The method as set forth in claim 17, further comprising forming an organic layer on each said black matrix.

* * * * *